US012559857B2

(12) United States Patent
Park et al.

(10) Patent No.: US 12,559,857 B2
(45) Date of Patent: Feb. 24, 2026

(54) METHOD FOR CONTROLLING SUPPLY OF SOLID SILICON TO PRELIMINARY CRUCIBLE OF INGOT GROWTH APPARATUS

(71) Applicant: HANWHA SOLUTIONS CORPORATION, Seoul (KR)

(72) Inventors: Jin Sung Park, Seoul (KR); Keun Ho Kim, Seoul (KR); Young Min Lee, Seoul (KR); Han Woong Jeon, Seoul (KR)

(73) Assignee: Hanwha Solutions Corporation, Seoul (KR)

( * ) Notice: Subject to any disclaimer, the term of this patent is extended or adjusted under 35 U.S.C. 154(b) by 172 days.

(21) Appl. No.: 18/546,046

(22) PCT Filed: Jun. 17, 2022

(86) PCT No.: PCT/KR2022/008615
§ 371 (c)(1),
(2) Date: Aug. 10, 2023

(87) PCT Pub. No.: WO2022/265449
PCT Pub. Date: Dec. 22, 2022

(65) Prior Publication Data
US 2024/0125002 A1    Apr. 18, 2024

(30) Foreign Application Priority Data
Jun. 18, 2021    (KR) ........................ 10-2021-0079192

(51) Int. Cl.
C30B 15/02        (2006.01)
C30B 15/20        (2006.01)
C30B 29/06        (2006.01)

(52) U.S. Cl.
CPC .............. C30B 15/02 (2013.01); C30B 15/20 (2013.01); C30B 29/06 (2013.01)

(58) Field of Classification Search
CPC ......... C30B 15/00; C30B 15/02; C30B 15/20; C30B 29/00; C30B 29/02; C30B 29/06; C30B 35/00; C30B 35/007

(Continued)

(56) References Cited

U.S. PATENT DOCUMENTS 7,635,414 B2 *  12/2009  Bender ................... C30B 15/22
                                                    117/223

FOREIGN PATENT DOCUMENTS

JP       2009-263174 A     11/2009
JP       2018-039690 A      3/2018
(Continued)

OTHER PUBLICATIONS

International Search Report for International application No. PCT/KR2022/008615 dated Sep. 20, 2022.
(Continued)

*Primary Examiner* — Kenneth A Bratland, Jr.
(74) *Attorney, Agent, or Firm* — Harness, Dickey & Pierce, P.L.C.

(57) ABSTRACT

Disclosed is a method for controlling the supply of solid silicon to a preliminary crucible of an ingot growth apparatus for maintaining a constant amount of molten silicon in the preliminary crucible by measuring the height of the molten silicon in the preliminary crucible. The method for controlling the supply of solid silicon to a preliminary crucible of an ingot growth apparatus, according to the present invention, is a method for controlling the supply of solid silicon to the preliminary crucible for supplying molten silicon to a main crucible of the ingot growth apparatus, the method comprising: a management range setting step of setting an appropriate management range of the molten silicon in the preliminary crucible; a height measuring step of measuring the height of the molten silicon contained in the preliminary crucible to confirm whether the molten silicon falls within an appropriate management range of the molten silicon; a supply amount determining step of determining a supply amount of solid silicon to be supplied to the preliminary crucible according to the height measured in the height measuring step; and a step of supplying a predetermined supply amount of solid silicon determined according to the supply amount determining step to the preliminary crucible.

11 Claims, 9 Drawing Sheets

(58) Field of Classification Search
USPC .......... 117/11, 13–15, 30, 33, 200–202, 206, 117/208, 214, 928, 930–931
See application file for complete search history.

(56)             References Cited

FOREIGN PATENT DOCUMENTS

| | | | |
|---|---|---|---|
| JP | 2020063163 | A * | 4/2020 |
| KR | 10-2012-0003223 | A | 1/2012 |
| KR | 101279709 | B1 | 6/2013 |
| WO | 2022265449 | A1 | 12/2022 |

OTHER PUBLICATIONS

Chung, J. W. et al.: "Manganese Zinc Ferrite Single Crystal Growth by Continuous Crystal Growing Method", Journal of the Korean Ceramic Society, vol. 29, No. 7, Jan. 1, 1992 (Jan. 1, 1992), pp. 539-543.

* cited by examiner

METHOD FOR CONTROLLING SUPPLY OF SOLID SILICON TO PRELIMINARY CRUCIBLE OF INGOT GROWTH APPARATUS

CROSS-REFERENCE TO RELATED APPLICATIONS

This application is a national phase under 35 U.S.C. § 371 of PCT International Application No. PCT/KR2022/008615 which has an International filing date of Jun. 17, 2022, which claims priority to Korean Patent Application No. 10-2021-0079192, filed Jun. 18, 2021, the entire contents of each of which are hereby incorporated by reference.

TECHNICAL FIELD

The present invention relates to a method for controlling the supply of solid silicon to a preliminary crucible of an ingot growth apparatus for maintaining a constant amount of molten silicon in the preliminary crucible by measuring the height of the molten silicon in the preliminary crucible.

BACKGROUND ART

In general, a system for controlling the amount of polysilicon introduced into a preliminary melting device by measuring the weight of a main crucible has been disclosed.

That is, according to the related art, Korean Registered Patent No. 1279709 is disclosed. The related art is a system for controlling the input amount of molten silicon by measuring the weight of a main crucible, and it discloses an apparatus that maintains a constant melting level by adjusting the amount of polysilicon introduced into a preliminary melting device, as the weight of the main crucible containing the molten silicon decreases while continuously measuring the weight of the main crucible.

However, in the related art, when molten silicon overflows due to any problem in the preliminary melting device, it is not detected in advance, and thus, there is a problem in that the leakage of molten silicon may occur.

In addition, the related art has a problem in that the process can no longer proceed because there is no way to cope with problems in the control function for introducing a constant amount into the preliminary melting device.

Further, in the case of the related art, the total weight of the rotating main crucible must be continuously measured, and a lot of noise occurs due to movement during weight measurement, and precise control has been problematic because the weight of the molten silicon to be controlled is too small compared to the total weight to be measured.

DISCLOSURE

Technical Problem

According to the present invention, it is directed to providing a method for controlling the supply of solid silicon in a preliminary crucible of an ingot growth apparatus that can maintain a constant amount of molten silicon in a preliminary crucible by measuring the height of molten silicon in the preliminary crucible and controlling the amount of solid silicon provided to the preliminary crucible based thereon.

Technical Solution

The method for controlling the supply of solid silicon to a preliminary crucible of an ingot growth apparatus according to an aspect of the present invention is a method for controlling the supply of solid silicon to the preliminary crucible for supplying molten silicon to a main crucible of the ingot growth apparatus, and the method may include a management range setting step of setting an appropriate management range of the molten silicon in the preliminary crucible; a height measuring step of measuring the height of the molten silicon contained in the preliminary crucible to confirm whether the molten silicon falls within an appropriate management range of the molten silicon; a supply amount determining step of determining a supply amount of solid silicon to be supplied to the preliminary crucible according to the height measured in the height measuring step; and a step of supplying a predetermined supply amount of solid silicon determined according to the supply amount determining step to the preliminary crucible.

In this case, the management range setting step may include a step of forming at least one imaginary line on the upper surface of the preliminary crucible; a step of forming a plurality of level lines on the upper surface of the preliminary crucible corresponding to the heights of an upper limit line, a lower limit line and a maximum upper limit line higher than the upper limit line of the molten silicon to define an appropriate management range of the molten silicon; and a step of setting points where the at least one imaginary line and the upper limit line, the lower limit line and the maximum upper limit line of the plurality of level lines intersect as an upper limit point, a lower limit point and a maximum upper limit point of the appropriate management range.

In this case, the imaginary line may be parallel to one side wall surface of the preliminary crucible when viewed in the supply direction of the molten silicon.

In this case, the imaginary line may be at least two, and the at least two imaginary lines may be to be disposed spaced apart from each other at a predetermined interval in the supply direction of the molten silicon.

In this case, the height measuring step may measure the height of the molten silicon contained in the preliminary crucible in a state where the molten silicon is positioned to be maximally accommodated in the preliminary crucible.

In this case, the height measuring step may measure the height of the molten silicon by confirming whether the molten silicon contained in the preliminary crucible has reached the upper limit point, the lower limit point and the maximum upper limit point.

In this case, the supply amount determining step may include a step of supplying solid silicon having a preset standard weight to the preliminary crucible, if the height of the molten silicon contained in the preliminary crucible is less than the upper limit line of the appropriate management range of the molten silicon, and is greater than or equal to the lower limit line of the management range.

In this case, the supply amount determining step may include a step of supplying solid silicon having a weight less than a preset standard weight to the preliminary crucible, if the height of the molten silicon contained in the preliminary crucible is less than the maximum upper limit line which is higher than the upper limit line among the heights that have been set in the appropriate management range of the molten silicon, and is greater than or equal to the upper limit line of the appropriate management range.

In this case, the supply amount determining step may include a step of supplying solid silicon having a weight greater than a preset standard weight of solid silicon to the preliminary crucible, if the height of the molten silicon contained in the preliminary crucible is less than the lower limit line among the heights that have been set in the appropriate management range of the molten silicon.

In this case, the supply amount determining step may include a step of stopping the supply of the solid silicon, if the height of the molten silicon contained in the preliminary crucible is greater than or equal to the maximum upper limit line, which is higher than the upper limit line among the heights that have been set in the appropriate management range of the molten silicon.

In this case, the management range setting step may include a step of setting a position on the upper surface of the preliminary crucible at which deformation due to temperature does not occur as a coordinate reference point; a step of forming a plurality of level lines on the upper surface of the preliminary crucible corresponding to the heights of an upper limit line, a lower limit line and a maximum upper limit line which is higher than the upper limit line to define an appropriate management range of the molten silicon; a step of setting a plurality of measurement points on the plurality of level lines; and a step of setting relative coordinates of a plurality of measurement points with respect to the coordinate reference point.

In this case, the height measuring step may determine that the molten silicon has reached a predetermined level line height, if it is confirmed that there is the molten silicon at a preset number or more measurement points among the plurality of measurement points on the relative coordinates.

Advantageous Effects

According to the above configuration, the method for controlling the supply of solid silicon to a preliminary crucible of an ingot growth apparatus according to the present invention can always keep the amount of molten silicon introduced into a main crucible constant, and as a result, the temperature of molten silicon introduced into the main crucible can also be kept constant. Accordingly, when molten silicon is introduced into the main crucible, as a constant amount is always introduced, the temperature change in the main crucible always varies within a constant range, which can lead to yield improvement.

According to the present invention, when there is an error in the quantitative control device, it can serve as a preliminary quantitative control device for introducing a constant amount into the main crucible. Therefore, when an error occurs in the quantitative control device, the process can continue without a shutdown of the entire system.

According to the present invention, it is possible to prevent a dangerous situation in which molten silicon in the preliminary crucible overflows and damages related devices and instruments, and it is also possible to prevent cost loss therefrom.

MODES OF THE INVENTION

Figure 1:
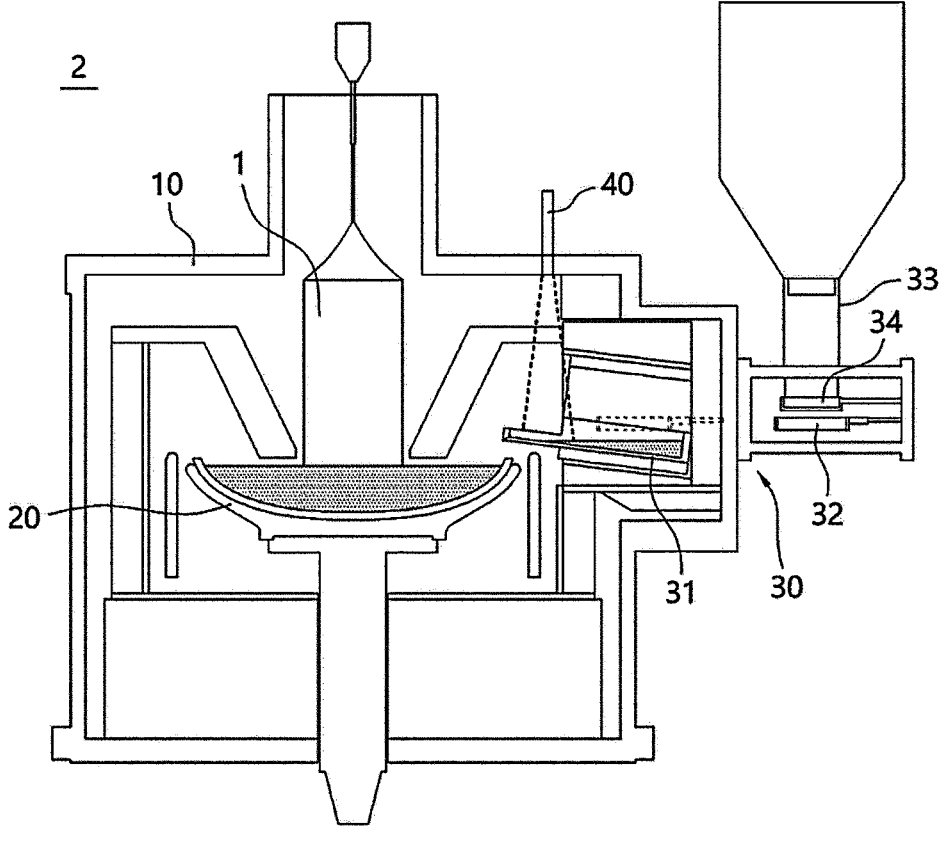
FIG. 1 is an internal configuration diagram of an ingot growing device for controlling the supply of solid silicon to a preliminary crucible of the ingot growing device according to an exemplary embodiment of the present invention.

Terms and words used in the present specification and claims should not be construed as limited to their usual or dictionary definition, and they should be interpreted as a meaning and concept consistent with the technical idea of the present invention based on the principle that inventors may appropriately define the terms and concept in order to describe their own invention in the best way.

Accordingly, the exemplary embodiments described in the present specification and the configurations shown in the drawings correspond to preferred exemplary embodiments of the present invention, and do not represent all the technical spirit of the present invention, and thus, the configurations may have various examples of equivalent and modification that can replace them at the time of filing the present invention.

It is understood that the terms "include" or "have", when used in the present specification, are intended to describe the presence of stated features, integers, steps, operations, elements, components and/or a combination thereof but do not preclude the possibility of the presence or addition of one or more other features, integers, steps, operations, elements, components or a combination thereof.

The presence of an element in/on "front", "rear", "upper or above or top" or "lower or below or bottom" of another element includes not only being disposed in/on "front", "rear", "upper or above or top" or "lower or below or bottom" directly in contact with other elements, but also cases in which another element being disposed in the middle, unless otherwise specified. In addition, unless otherwise specified, that an element is "connected" to another element includes not only direct connection to each other but also indirect connection to each other.

Hereinafter, the method for controlling the supply of solid silicon to a preliminary crucible of an ingot growth apparatus according to the present invention will be described with reference to the drawings.

First of all, an ingot growth apparatus to which the method for controlling the supply of solid silicon to a preliminary crucible of an ingot growth apparatus according to the present invention is applied will be described.

Referring to FIGS. 1 to 4, in the ingot growth apparatus 2, a main crucible 20 is installed inside a vacuum chamber 10, and molten silicon 1a is supplied to the main crucible 20. While the main crucible 20 rotates, the molten silicon 1a is raised and cooled along a seed to grow into a single crystal ingot 1.

In this case, the ingot growth device 2 is provided with a preliminary melting device 30 for continuously supplying molten silicon 1a to the main crucible 20 in order to grow a maximum number of ingots 1 at one time.

Figure 6:
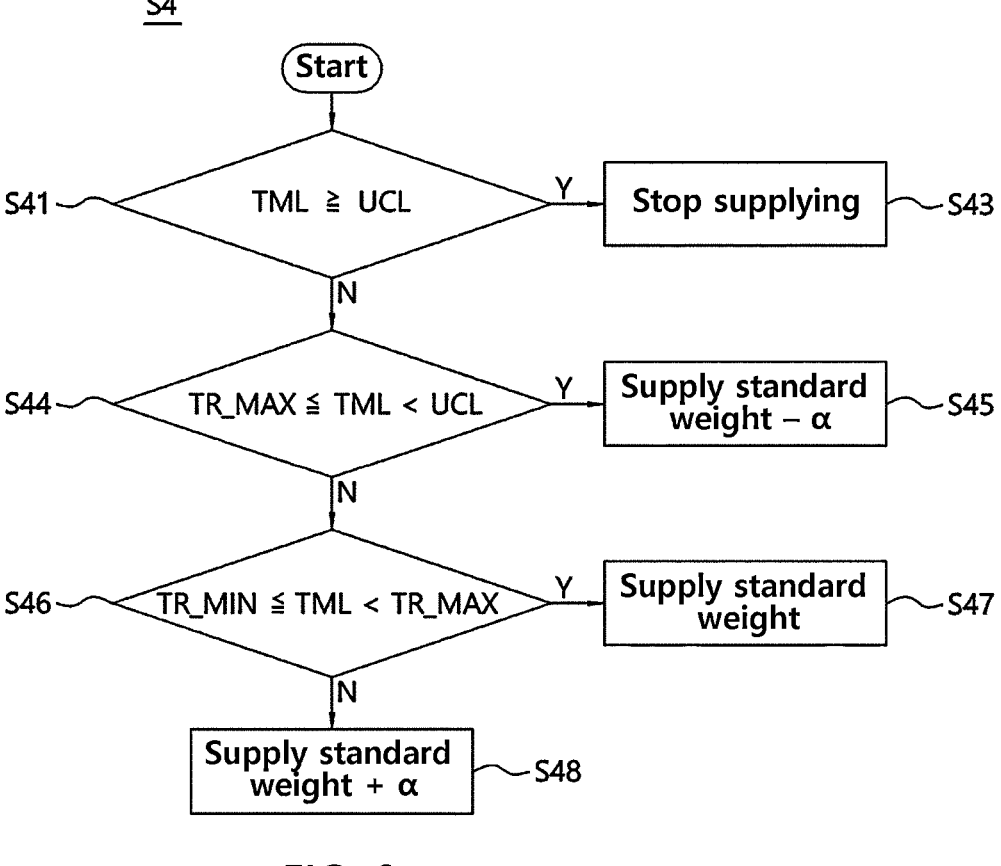
FIG. 6 is a flow chart of the supply amount determining step as illustrated in FIG. 5.
Figure 7:
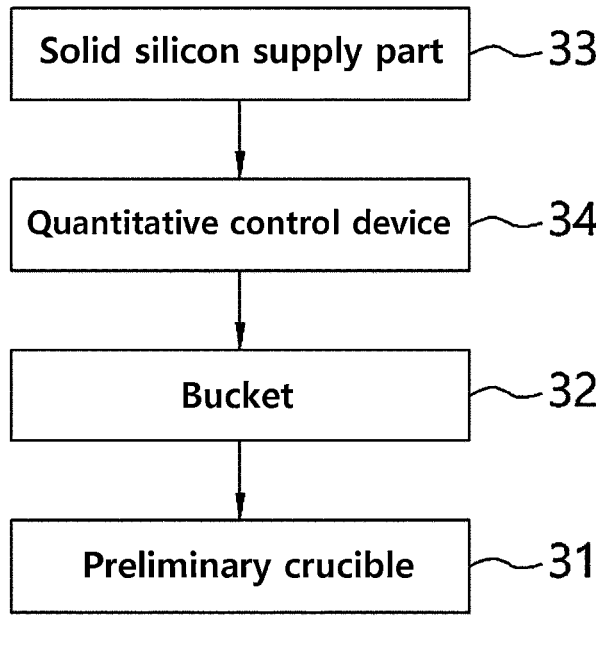
FIG. 7 is a block diagram of components for providing solid silicon applied to the method for controlling the supply of solid silicon to a preliminary crucible of an ingot growth apparatus according to an exemplary embodiment of the present invention.

In this case, referring to FIG. 6, the preliminary melting device 30 receives the supply of solid silicon from a solid silicon supply part 33. Solid silicon is contained in a bucket 32 and then supplied to the preliminary crucible 31 inside the vacuum chamber 10. Since the solid silicon of the solid silicon supply part 33 is weighed by a quantitative control device 34 and a quantitative amount of solid silicon is supplied to the bucket 32, the quantitative amount of solid silicon may be supplied to the preliminary crucible 31.

In this case, the solid silicon supplied to the preliminary crucible 31 is melted by a heater. When the heat source is supplied for a certain period of time and the melting of silicon is completed, the preliminary crucible 31 supplies the molten silicon 1a to the main crucible 20 in a way that the preliminary crucible 31 tilts forward.

The method for controlling the supply of solid silicon to a preliminary crucible of an ingot growth apparatus according to an exemplary embodiment of the present invention is a method for controlling the supply of solid silicon to a preliminary crucible 31 for supplying molten silicon to a main crucible 20 of an ingot growth apparatus 2, and it includes a management range setting step S1, a height measuring step S2, a step of supplying molten silicon to the main crucible 20, a supply amount determining step S4 and a solid silicon supplying step S5.

In the management range setting step S1, referring to FIGS. 1 to 6, an appropriate management range of the molten silicon inside the preliminary crucible 31 may be set.

In this case, the management range setting step S1 may include a step of forming at least one imaginary line ST1, ST2 on the upper surface of the preliminary crucible 31, a step of forming a plurality of level lines TML on the upper surface of the preliminary crucible 31 corresponding to the heights of an upper limit line, a lower limit line and a maximum upper limit line higher than the upper limit line of the molten silicon to define an appropriate management range of the molten silicon, and a step of setting points where the at least one imaginary line ST1, ST2 and the upper limit line, the lower limit line and the maximum upper limit line of the plurality of level lines intersect as an upper limit point TR1_MAX, TR2_MAX, a lower limit point TR1_MIN, TR2_MIN and a maximum upper limit point UCL1, UCL2 of the appropriate management range.

Figure 3:
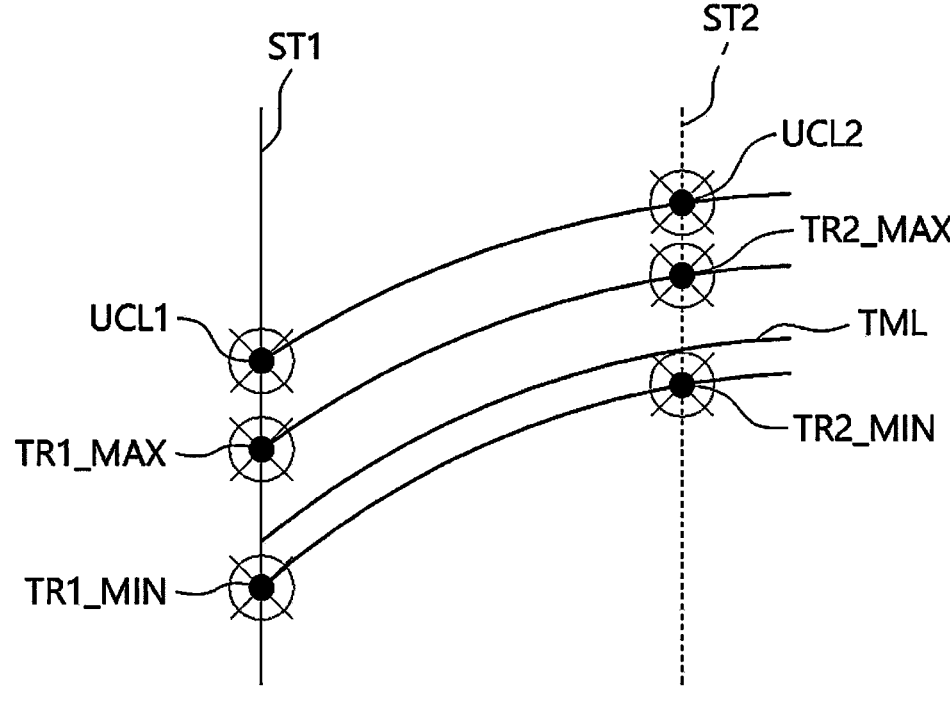
FIG. 3 is an enlarged mimetic view of a molten silicon level line and an imaginary straight-line portion as illustrated in FIG. 2.
Figure 4:
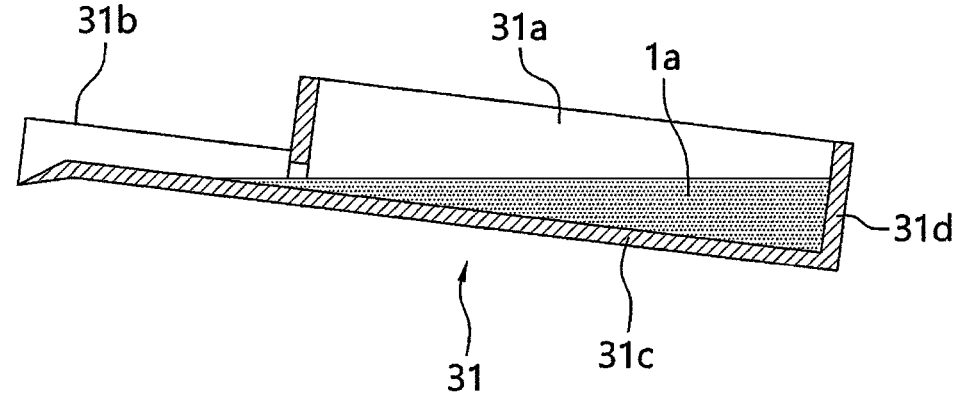
FIG. 4 is a cross-sectional view of a preliminary crucible, which is a part of components of the ingot growth apparatus for controlling the supply of solid silicon to the preliminary crucible of the ingot growth apparatus according to an exemplary embodiment of the present invention.

In this case, referring to FIG. 3, the imaginary lines ST1, ST2 may be parallel to one side wall surface of the preliminary crucible, that is, a first plane 31d when viewed in the supply direction of the molten silicon.

In this case, referring to FIG. 3, the imaginary lines ST1, ST2 may be at least two, and the at least two imaginary lines ST1, ST2 may be disposed to be spaced apart from each other by a predetermined interval D1 in the supply direction of the molten silicon.

In this case, since it is very difficult to scan the entire level line of molten silicon, the upper limit points TR1_MAX, TR2_MAX, the lower limit points TR1_MIN, TR2_MIN and the maximum upper limit points UCL1, UCL2 are set in advance, and it is possible to easily detect the molten silicon level line TML by using the same.

Figure 2:
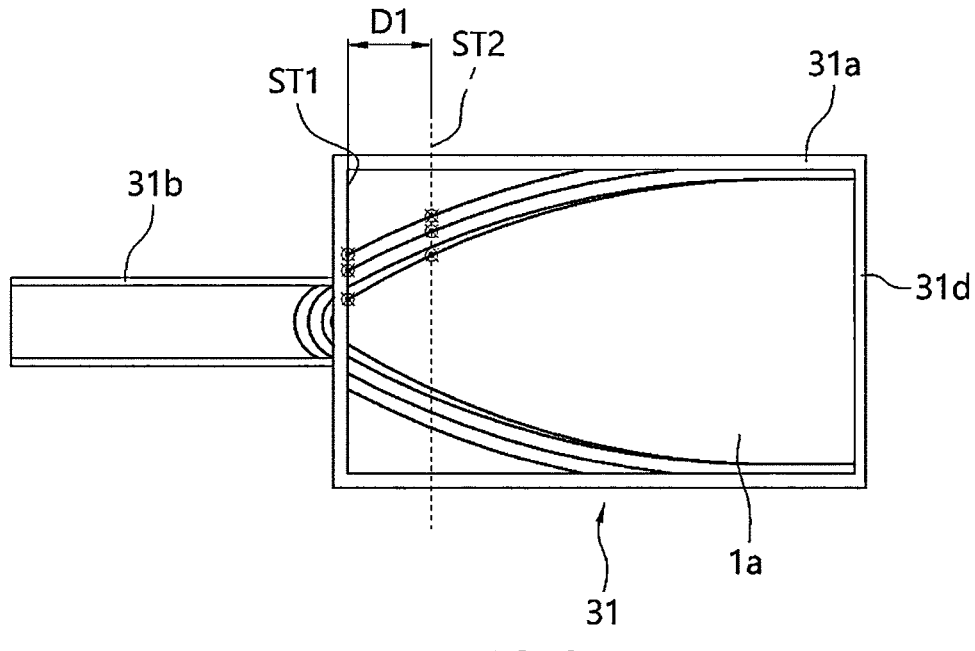
FIG. 2 is a plan view of a preliminary crucible, which is a part of components of the ingot growth apparatus for controlling the supply of solid silicon to the preliminary crucible of the ingot growth apparatus according to an exemplary embodiment of the present invention.

In this case, referring to FIGS. 2 and 3, as the level line TML of the molten silicon rises, the molten silicon may be detected at the upper limit points TR1_MAX, TR2_MAX, the lower limit points TR1_MIN, TR2_MIN and the maximum upper limit points UCL1, UCL2.

Herein, when two imaginary lines ST1, ST2 are applied, molten silicon is detected at two points for each level line, and thus, when it is determined that molten silicon is detected, it may be decided as a case where it is detected at one of the two points or a case where it is detected at all points.

In this case, the maximum upper limit points UCL1, UCL2 may be set to 5 to 10 mm or less from the top of a first plane 31d based on the first plane 31d in a state where the preliminary crucible 31 can accommodate the molten silicon to a maximum extent.

In the height measuring step S2, referring to FIGS. 2 to 6, the height of the molten silicon contained in the preliminary crucible 31 may be measured to determine whether the molten silicon falls within the appropriate management range of the molten silicon.

In this case, in the height measuring step S2, the height of the molten silicon contained in the preliminary crucible 31 may be measured in a state where the molten silicon is maximally accommodated in the preliminary crucible 31.

In this case, in the height measuring step S2, the height of the molten silicon may be measured by confirming whether the molten silicon contained in the preliminary crucible 31 has reached the upper limit points TR1_MAX, TR2_MAX, the lower limit points TR1_MIN, TR2_MIN and the maximum upper limit points UCL1, UCL2.

In this case, it is possible to determine whether the molten silicon has reached the upper limit points TR1_MAX, TR2_MAX, the lower limit points TR1_MIN, TR2_MIN and the maximum upper limit points UCL1, UCL2 based on the results detected through a viewer 40 which is installed on top of the melting crucible 31 as illustrated in FIG. 1.

In this case, molten silicon may be supplied S3 to the main crucible 20 between the height measuring step S2 and the supply amount determining step S4. That is, silicon in a state where the melting of the preliminary crucible 31 is completed may be supplied to the main crucible 20. Only when the molten silicon in the preliminary crucible 31 is emptied in this way, new solid silicon may be supplied to the preliminary crucible 31.

Figure 5:
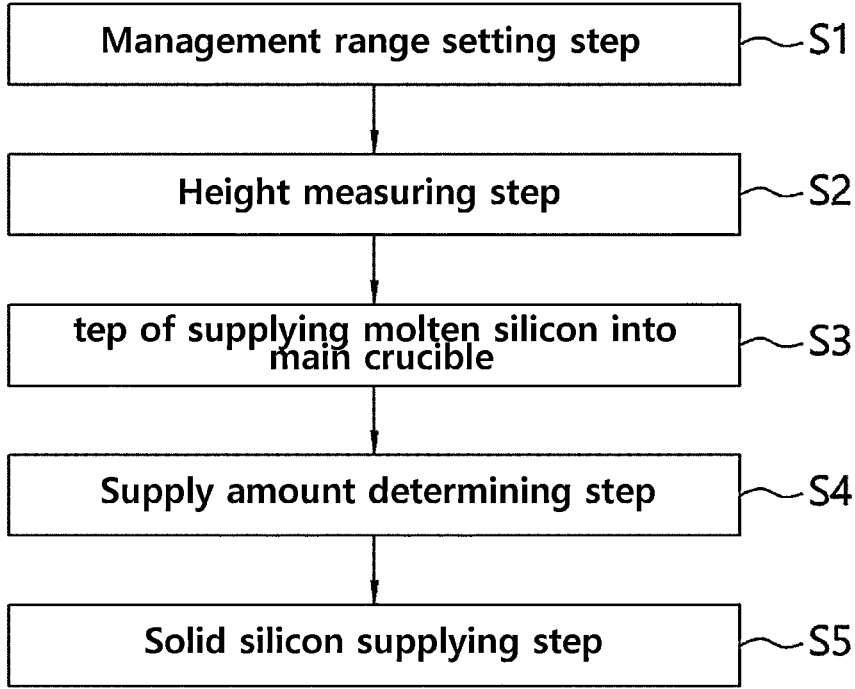
FIG. 5 is a flowchart of the method for controlling the supply of solid silicon to a preliminary crucible of an ingot growth apparatus according to an exemplary embodiment of the present invention.

In the supply amount determining step S4, referring to FIGS. 5 and 6, the supply amount of solid silicon to be supplied to the preliminary crucible 20 may be determined according to the height measured in the height measuring step S2.

In this case, referring to FIG. 6, the supply amount determining step S4 may include a step of supplying solid silicon having a preset standard weight S46, S47 to the preliminary crucible 31, if the height TML of the molten silicon contained in the preliminary crucible 31 is less than the upper limit line TR_MAX of the appropriate management range of the molten silicon, and is greater than or equal to the lower limit line TR_MIN of the management range.

In this case, referring to FIG. 6, the supply amount determining step S4 may include a step of supplying solid silicon having a weight less than a preset standard weight S44, S45 to the preliminary crucible 31, if the height TML of the molten silicon contained in the preliminary crucible 31 is less than the maximum upper limit line UCL which is higher than the upper limit line TR_MAX among the heights that have been set in the appropriate management range of the molten silicon, and is greater than or equal to the upper limit line TR_MAX of the appropriate management range.

In this case, referring to FIG. 6, the supply amount determining step S4 may include a step of supplying solid silicon having a weight greater than a preset standard weight of solid silicon S48 to the preliminary crucible 31, if the height TML of the molten silicon contained in the preliminary crucible 31 is less than the lower limit line TR_MIN among the heights that have been set in the appropriate management range of the molten silicon.

In this case, referring to FIG. 6, the supply amount determining step S4 may include a step of stopping the supply of the solid silicon S43, if the height TML of the molten silicon contained in the preliminary crucible 31 is greater than or equal to the maximum upper limit line UCL, which is higher than the upper limit line TR_MAX among the heights that have been set in the appropriate management range of the molten silicon. If the supply of solid silicon is not stopped in this way, a large-scale accident may occur where the molten silicon in the preliminary crucible 31 overflows. Therefore, this step is a very essential and important step.

In this case, all of the operations illustrated in FIG. 6 may be determined depending on whether molten silicon is detected at the upper limit points TR1_MAX, TR2_MAX, the lower limit points TR1_MIN, TR2_MIN and the upper limit points UCL1, UCL2 that have been decided by the viewer as described above.

In this way, by controlling the amount of molten silicon in the preliminary crucible 31 to be within an appropriate management range, the amount of molten silicon which is supplied to the main crucible 20 is maintained to be constant, and accordingly, by maintaining an appropriate temperature and an appropriate amount of molten silicon in the main crucible 20, it is possible to promote high-quality ingot growth.

In the step of supplying the solid silicon to the preliminary crucible S5, referring to FIGS. 5 and 6, a predetermined supply amount of solid silicon determined in the supply amount determining step S4 may be supplied to the preliminary crucible 31.

In this case, the format in which solid silicon is supplied to the preliminary crucible 31 may be classified into a step of supplying more solid silicon than the standard weight from a case where the molten silicon is at a low position according to the height of the molten silicon in the preliminary crucible 31, a step of supplying the standard weight, a step of supplying less than the standard weight, and finally a step of stopping the supply.

In this case, the supply of solid silicon is received from the solid silicon supply part 33, and the solid silicon is weighed by the quantitative control device 34, and a quantitative amount of the solid silicon is supplied to the bucket 32, and the solid silicon is supplied to the preliminary crucible 31 while being contained in the bucket 32. The quantitative control device 34 measures the determined quantity and supplies a quantitative amount of solid silicon to the preliminary crucible 31. Next, the solid silicon which has been supplied to the preliminary crucible 31 is melted by a heater. When the heat source is supplied for a certain period of time and the melting of the silicon is completed, the above-described height measuring step S2 is performed again.

Figure 8:
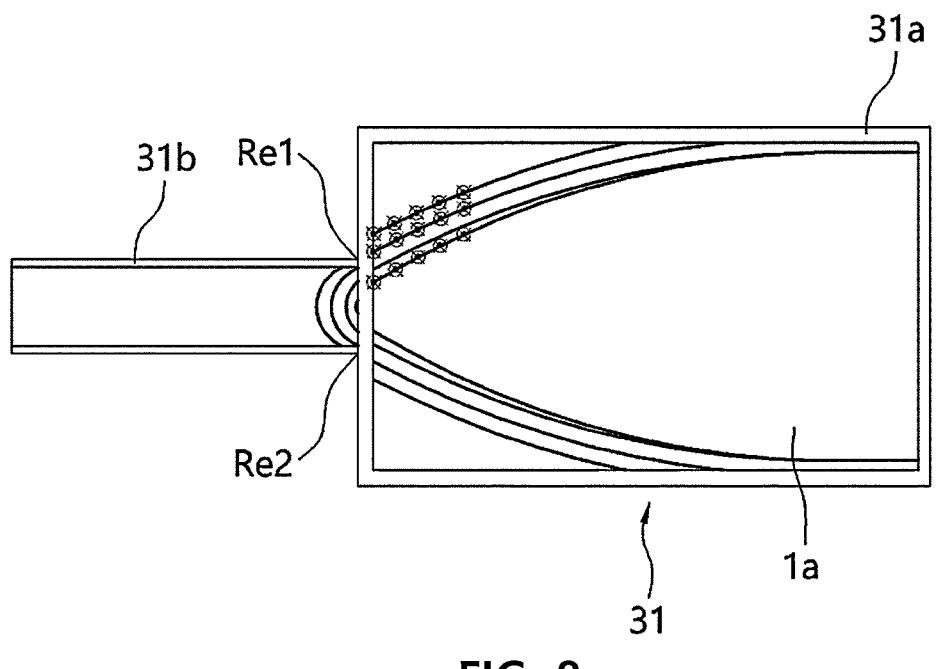
FIG. 8 is a plan view of a preliminary crucible of the ingot growth apparatus according to another exemplary embodiment of the present invention.
Figure 9:
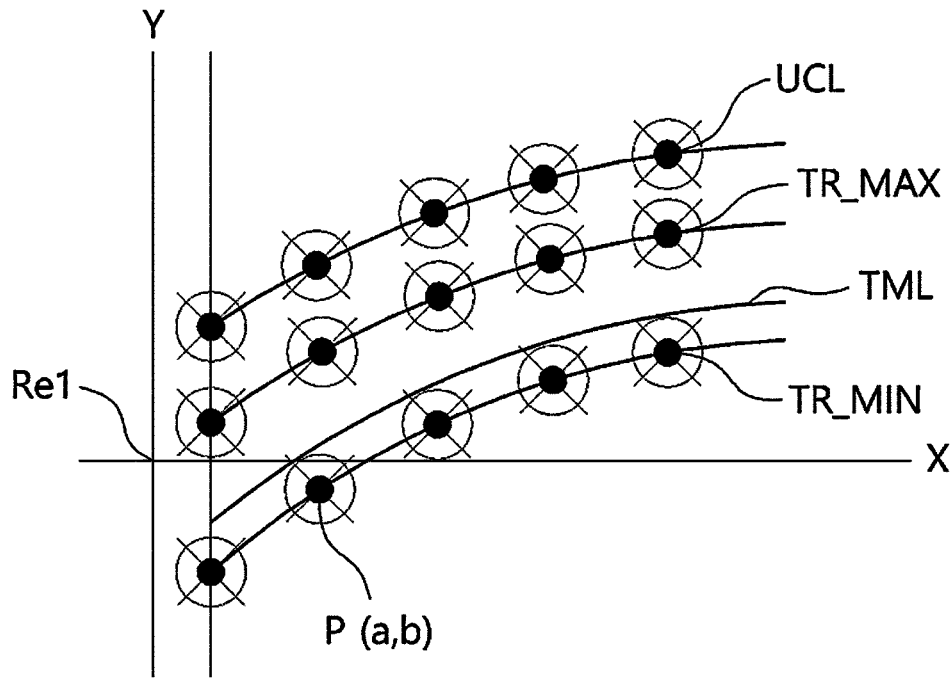
FIG. 9 is an enlarged mimetic view of a molten silicon level line and an imaginary straight-line portion as illustrated in FIG. 8.

Meanwhile, other examples according to the present invention are illustrated in FIGS. 8 and 9. There are differences in the management range setting step S1 and the height measuring step S2.

Referring to FIGS. 8 and 9, the management range setting step S1 may include a step of setting a position on the upper surface of the preliminary crucible 31 at which deformation due to temperature does not occur as a coordinate reference point Re1, Re2, a step of forming a plurality of level lines on the upper surface of the preliminary crucible 31 corresponding to the heights of an upper limit line TR_MAX, a lower limit line TR_MIN and a maximum upper limit line UCL which is higher than the upper limit line TR_MAX to define an appropriate management range of the molten silicon, a step of setting a plurality of measurement points P on the plurality of level lines, and a step of setting relative coordinates a, b of a plurality of measurement points P with respect to the coordinate reference point Re1, Re2.

In the height measuring step S2, referring to FIGS. 8 and 9, when molten silicon is confirmed at a predetermined number or more among the plurality of measurement points P on the relative coordinates, it may be determined that the molten silicon has reached a predetermined level line height.

Referring to FIG. 8, the preliminary crucible 31 includes a main body 31a and a spout portion 31b as described above, and the main body 31a is a place where solid silicon is supplied and melted. Since the main body 31a is placed in a thermally poor environment, deformation or the like may occur. Accordingly, when deformation occurs, the scan value of one level line may be different from an actual one. As a way to prevent the same, the point of the spout portion 31b, which is hardly deformed as described above, is set as the relative coordinate reference points Re1, Re2, and based thereon, the relative coordinates of a plurality of measurement points P along the level line are scanned, and based on the scanned result values, it is determined whether the molten silicon 1a has reached a predetermined level line.

Although the exemplary embodiments of the present invention have been described, the spirit of the present invention is not limited by the exemplary embodiments presented herein, and a person skilled in the art who understands the spirit of the present invention may easily suggest other exemplary embodiments by modifying, changing, deleting or adding components within the scope of the same spirit, but this will also be within the spirit of the present invention.

INDUSTRIAL APPLICABILITY

The present invention can be applied to an ingot growth apparatus for manufacturing a semiconductor wafer.

The invention claimed is:

1. A method for controlling a supply of solid silicon to a preliminary crucible for supplying molten silicon to a main crucible of an ingot growth apparatus, the method comprising:

a management range setting step of setting an appropriate management range of the molten silicon in the preliminary crucible;

a height measuring step of measuring a height of the molten silicon contained in the preliminary crucible to confirm whether the molten silicon falls within the appropriate management range of the molten silicon;

a supply amount determining step of determining a supply amount of solid silicon to be supplied to the preliminary crucible according to the height measured in the height measuring step; and a step of supplying a predetermined supply amount of solid silicon determined according to the supply amount determining step to the preliminary crucible, wherein the management range setting step comprises a step of forming at least one imaginary line on an upper surface of the preliminary crucible, wherein the at least one imaginary line is perpendicular to a supply direction of the solid silicon;

a step of forming a plurality of level lines on the upper surface of the preliminary crucible corresponding to a height of an upper limit line, a height of a lower limit line, and a height of a maximum upper limit line higher than the upper limit line of the molten silicon to define an appropriate management range of the molten silicon; and a step of setting points where the at least one imaginary line and the upper limit line, the lower limit line and the maximum upper limit line of the plurality of level lines intersect as an upper limit point, a lower limit point and a maximum upper limit point of the appropriate management range.

2. The method of claim 1, wherein the at least one imaginary line is parallel to one side wall surface of the preliminary crucible when viewed in a supply direction of the molten silicon.

3. The method of claim 2, wherein the at least one imaginary line is at least two, and wherein the at least two imaginary lines are to be disposed spaced apart from each other at a predetermined interval in the supply direction of the molten silicon.

4. The method of claim 1, wherein the height measuring step measures the height of the molten silicon contained in the preliminary crucible in a state where the molten silicon is positioned to be maximally accommodated in the preliminary crucible.

5. The method of claim 1, wherein the height measuring step measures the height of the molten silicon by confirming whether the molten silicon contained in the preliminary crucible has reached the upper limit point, the lower limit point and the maximum upper limit point.

6. The method of claim 1, wherein the supply amount determining step comprises a step of supplying solid silicon having a preset standard weight to the preliminary crucible, if the height of the molten silicon contained in the preliminary crucible is less than the upper limit line of the appropriate management range of the molten silicon, and is greater than or equal to the lower limit line of the appropriate management range.

7. The method of claim 1, wherein the supply amount determining step comprises a step of supplying solid silicon having a weight less than a preset standard weight to the preliminary crucible, if the height of the molten silicon contained in the preliminary crucible is less than the maximum upper limit line which is higher than the upper limit line among the heights that have been set in the appropriate management range of the molten silicon, and is greater than or equal to the upper limit line of the appropriate management range.

8. The method of claim 1, wherein the supply amount determining step comprises a step of supplying solid silicon having a weight greater than a preset standard weight of solid silicon to the preliminary crucible, if the height of the molten silicon contained in the preliminary crucible is less than the lower limit line among the heights that have been set in the appropriate management range of the molten silicon.

9. The method of claim 1, wherein the supply amount determining step comprises a step of stopping the supply of the solid silicon, if the height of the molten silicon contained in the preliminary crucible is greater than or equal to the maximum upper limit line, which is higher than the upper limit line among the heights that have been set in the appropriate management range of the molten silicon.

10. A method for controlling a supply of solid silicon to a preliminary crucible for supplying molten silicon to a main crucible of an ingot growth apparatus, the method comprising a management range setting step of setting an appropriate management range of the molten silicon in the preliminary crucible;

a height measuring step of measuring a height of the molten silicon contained in the preliminary crucible to confirm whether the molten silicon falls within the appropriate management range of the molten silicon;

a supply amount determining step of determining a supply amount of solid silicon to be supplied to the preliminary crucible according to the height measured in the height measuring step; and a step of suppling a predetermined supply amount of solid silicon determined according to the supply amount determining step to the preliminary crucible, wherein the management range setting step comprises:

a step of setting a position on an upper surface of the preliminary crucible at which deformation due to temperature does not occur as a coordinate reference point;

a step of forming a plurality of level lines on the upper surface of the preliminary crucible corresponding to a height of an upper limit line, a height of a lower limit line, and a height of a maximum upper limit line which is higher than the upper limit line to define an appropriate management range of the molten silicon;

a step of setting a plurality of measurement points on the plurality of level lines; and a step of setting relative coordinates of the plurality of measurement points with respect to the coordinate reference point.

11. The method of claim 10, wherein the height measuring step determines that the molten silicon has reached a predetermined level line height, if it is confirmed that there is the molten silicon at a preset number or more measurement points among the plurality of measurement points on the relative coordinates.

* * * * *